United States Patent
Roth et al.

(10) Patent No.: US 9,485,598 B2
(45) Date of Patent: Nov. 1, 2016

(54) METHOD AND A DEVICE FOR MEASURING THE AMPLITUDE NOISE AND/OR PHASE NOISE OF A SIGNAL

(71) Applicant: Rohde & Schwarz GmbH & Co. KG, Munich (DE)

(72) Inventors: Alexander Roth, Dorfen (DE); Thomas Bechteler, Aschheim (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 96 days.

(21) Appl. No.: 14/329,688

(22) Filed: Jul. 11, 2014

(65) Prior Publication Data

US 2015/0016616 A1    Jan. 15, 2015

(30) Foreign Application Priority Data

Jul. 12, 2013    (DE) .................... 10 2013 213 657

(51) Int. Cl.
   *H04R 29/00*      (2006.01)
   *G01R 29/26*      (2006.01)

(52) U.S. Cl.
   CPC ............. *H04R 29/00* (2013.01); *G01R 29/26* (2013.01)

(58) Field of Classification Search
   None
   See application file for complete search history.

(56) References Cited

U.S. PATENT DOCUMENTS

| | | | | |
|---|---|---|---|---|
| 5,001,724 A * | 3/1991 | Birgenheier | ............ | G01R 23/20 329/304 |
| 7,116,092 B2 * | 10/2006 | Jenkins | .................. | G01R 23/16 324/76.19 |
| 2005/0175127 A1 * | 8/2005 | Balz | ........................ | H04L 1/24 375/346 |
| 2005/0238094 A1 * | 10/2005 | Bessho | .................. | H04B 3/462 375/226 |
| 2008/0075299 A1 | 3/2008 | Rzyski et al. | | |
| 2008/0123788 A1 | 5/2008 | Wongwirawat et al. | | |
| 2010/0048143 A1 * | 2/2010 | Wendler | ................ | G01R 29/26 455/67.13 |
| 2012/0217980 A1 * | 8/2012 | Pausini | ............ | G01R 31/31709 324/613 |
| 2013/0057350 A1 * | 3/2013 | Riekki | ...................... | H03F 1/56 330/291 |
| 2013/0221946 A1 * | 8/2013 | Eckert | .................... | G01R 29/26 324/86 |

FOREIGN PATENT DOCUMENTS

| | | | |
|---|---|---|---|
| DE | 10246316 A1 | 4/2004 | |
| DE | 102005007072 A1 | 8/2006 | |
| DE | 102007012122 A1 | 9/2008 | |
| DE | 102011011978 A1 * | 1/2011 | ............ G01R 29/26 |
| DE | 102011004572 A1 | 8/2012 | |
| EP | 0366160 A1 | 1/1987 | |

* cited by examiner

*Primary Examiner* — Brenda Bernardi

(74) *Attorney, Agent, or Firm* — Ditthavong & Steiner, P.C.

(57) ABSTRACT

A method and a device for determining an amplitude noise and/or phase noise contained within a signal performs a quadrature mixing of the signal containing the amplitude noise and/or the phase noise into the baseband or intermediate-frequency band and an amplitude demodulation downstream of the quadrature mixing in order to determine the amplitude noise contained within the signal and a phase demodulation downstream of the quadrature mixing in order to determine the phase noise contained within the signal.

15 Claims, 8 Drawing Sheets

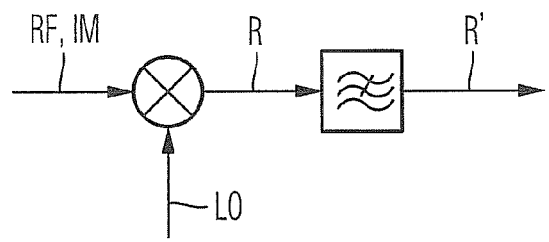
Fig. 7A
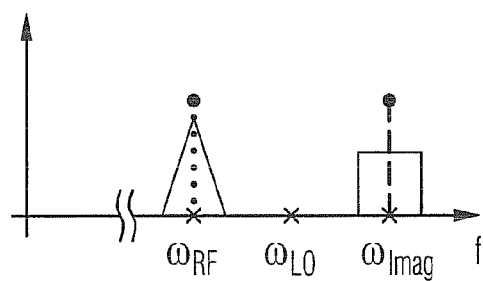 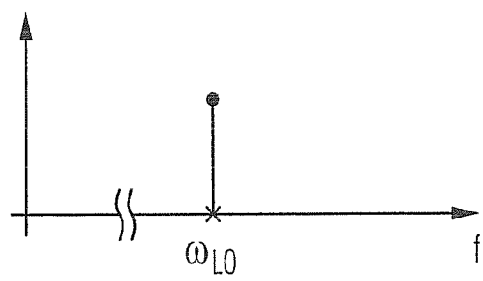
Fig. 7B    Fig. 7C
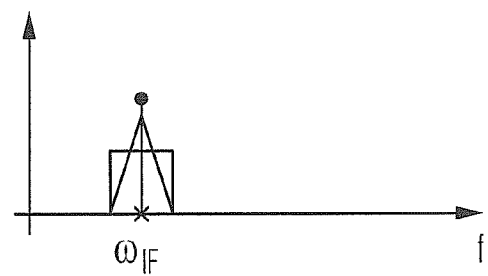
Fig. 7D

METHOD AND A DEVICE FOR MEASURING THE AMPLITUDE NOISE AND/OR PHASE NOISE OF A SIGNAL

RELATED APPLICATION

The invention relates to a method and a device for measuring the amplitude noise and/or phase noise of a signal and claims priority of German Patent Application DE 10 2013 213 657.9 filed Jul. 12, 2013.

BACKGROUND

Noise—substantially thermal noise and 1/f-noise—is superposed on every electrical payload signal. Additionally, noise—so-called residual noise (English: residual noise)—is generated in every device under test, which is additionally superposed on the already noisy electrical signal which is processed by the device under test.

In order to maximise the signal-noise interval of the electrical signal in a signal-processing unit, a measurement of the noise contained in the electrical payload signal is indispensable. In this context, a distinction must be made between an amplitude noise variable in amplitude and a phase noise variable in phase.

DE 10 2007 012 122 A1 discloses a method and a device for measuring the phase noise of an electrical signal which represents the prior art in phase-noise measurement technology. In this context, the phase noise contained in the measurement signal is separated from the measurement signal without noise by mixing the measurement signal in a mixer of a phase-locked loop (PLL) with a reference signal generated by the voltage-controlled oscillator of the phase-locked loop. In the controlled condition of the phase-locked loop, a reference signal, which corresponds to the measurement signal without phase noise, is obtained at the output of the voltage-controlled oscillator, while the phase noise of the measurement signal to be determined is disposed correspondingly at the output of a phase detector associated with the phase-locked loop.

In the phase-locked loop, only the phase noise contained within the measurement signal is unambiguously selectable and accordingly detectable, since the amplitude noise also contained in the measurement signal is suppressed or respectively attenuated by the mixer of the phase-locked loop and is therefore not available for an accurate measurement. Added to this, the phase-locked loop provides the disadvantageous property of suppressing phase noise in the environment of the carrier frequency of the measurement signal (PLL suppression), and accordingly, does not deliver an exact copy of the phase noise of the measurement signal over the entire measurement-frequency range. Finally, the phase-locked loop is typically provided with a relatively high time constant which disadvantageously determines a relatively low controlling or respectively settling of the phase-locked loop. In the case of relatively high phase jumps of the measurement signal—inter alfa, in the case of phase jumps >90°—a settling of the phase-locked loop is not at all possible.

A device for measuring the amplitude noise and phase noise which is generated in a device under test and superposed on the already present phase noise of the electrical signal processed by the device under test is known from US 2008/0075299 A1. In this context, the excitation signal is supplied in a first signal path to the device under test (DUT), while the same excitation signal is supplied in a second signal path to a series circuit comprising an adjustable attenuator and an adjustable phase shifter. The output signals of the first and second signal path are supplied to the two inputs of a 3-dB hybrid coupler, so that a carrierless signal is present at one output of the 3 dB hybrid coupler, and a signal amplified at its carrier frequency is present at the other output of the 3-dB hybrid coupler. The carrierless signal is supplied to an amplifier, and the signal amplified in its carrier frequency is supplied to a phase shifter, while the output signals of the amplifier and the phase shifter are mixed in a mixer. The signal at the output of the mixer represents the amplitude noise of the device under test if the phase shifter generates a phase of the signal amplified in its carrier frequency phase-synchronous to the phase of the amplified carrierless signal. The phase noise of the device under test is present at the output of the mixer if the phase shifter generates a phase of the signal amplified in its carrier frequency phase-shifted by 90° relative to the phase of the amplified carrierless signal.

The device of US 2008/0075299 A1 demands a very high-effort, processor-supported adjustment of the phase shifter and the attenuator. Additionally, a very high-quality signal source is required to generate the excitation signal for the first and second signal path with very good amplitude-noise and phase-noise properties. Finally, the amplitude noise and phase noise of the device under test cannot be measured simultaneously, since the second phase shifter must be reset in every case for the amplitude-noise measurement and phase-noise measurement.

An object of the invention is therefore to provide a method and a device for measuring simultaneously the amplitude noise and the phase noise of an electrical signal under test and/or a device under test which no longer provides the disadvantages named above.

SUMMARY

With the method according to the invention and the device according to the invention, instead of a mixing using a real mixer, a mixing is implemented with a quadrature mixer. The signal generated by the mixer consequently represents a complex signal from the magnitude of which the amplitude noise contained in a signal under investigation can be derived and from the phase of which the phase noise contained in a signal under investigation can be derived simultaneously. According to the invention, an amplitude demodulator is provided downstream of the quadrature mixer for the determination of the amplitude noise contained in the signal, and a phase demodulator is provided for the determination of the phase noise contained in the signal.

While, in the case of the real mixer, the subtractive intermodulation products between the high-frequency payload-signal components to be mixed, or respectively the high-frequency reflected-signal components and the oscillator signal generated by the local oscillator of the real mixer, are superposed on the output signal of the real mixer at the same frequencies, and accordingly, spectral components of the high-frequency payload-signal components to be mixed cannot be derived unambiguously from the baseband signal or respectively intermediate-frequency band signal at the output of the real mixer, the baseband signal or respectively the intermediate-frequency band signal at the output of the quadrature mixer according to the invention provides—as will be explained below—spectral components assignable only and unambiguously to the high-frequency payload-signal components to be mixed.

In order not to generate any baseband signal or respectively intermediate-frequency band signal with additional spectral components at the output of the quadrature mixer which come to be disposed in the proximity of the first-order intermodulation products, the higher-harmonic spectral components of the high-frequency signal under investigation are preferably removed with the low-pass characteristic of a band-pass filter.

Additionally, low-frequency noise components are removed by the high-pass characteristic of the band-pass filter.

The band-pass filter is preferably designed in such a manner that both the higher-harmonic spectral components and also the low-frequency noise components of the high-frequency signal under investigation are absorbed in the band-pass filter and not reflected by the band-pass filter, exerting an interfering effect on the device under test or the signal source of the high-frequency signal under investigation or other signal paths of the device for measuring the amplitude noise and phase noise.

In a first preferred embodiment of the invention, the signal to be investigated with regard to its amplitude-noise and/or phase-noise components, which is a high-frequency signal, is a signal which is generated by a signal source, for example, a frequency oscillator or a signal synthesiser, and, in a second preferred embodiment of the invention, a signal which, in the case of an excitation of an device under test with an excitation signal at its input contains the amplitude noise and phase noise generated by the device under test in its output signal.

In the case of the second embodiment of the invention, the excitation signal of the device under test is preferably formed by the oscillator signal of the local oscillator associated with the quadrature mixer.

In order to remove the amplitude noise and phase noise additionally generated in each case in the local oscillator of the quadrature mixer and in an analog-digital converter or respectively an amplifier disposed downstream of the quadrature mixer from the signal to be evaluated from the amplitude demodulator and phase demodulator, the signal to be investigated and superposed with an amplitude noise and phase noise is advantageously split in a unit for signal splitting, into two phase-synchronous and approximately identical partial signals which provide an identical amplitude and phase characteristic. The two partial signals are each mixed into the baseband or intermediate-frequency band in a quadrature mixer in their respective signal path. The two baseband or respectively intermediate-frequency band signals are supplied to a cross-correlator and subjected to a cross-correlation.

The signal at the output of the cross-correlator preferably contains only the amplitude-noise components and phase-noise components of the two partial signals which are derived from the original high-frequency signal under investigation, while the amplitude-noise and phase-noise components generated in each of the local oscillators of the two quadrature mixers, in the analog-digital converters and the amplifiers, which are each different from one another, are masked by the cross-correlation. The amplitude noise is determined in an equivalent manner through amplitude demodulation of the signal generated by the cross-correlator, while the phase noise is determined by phase demodulation of the signal generated by the cross-correlator.

BRIEF DESCRIPTION OF THE DRAWINGS

In the following, the preferred embodiments and sub-variants of the device according to the invention and the method according to the invention are explained in detail by way of example with reference to the drawings. The Figs. of the drawings show:

FIG. 7A a block-circuit diagram of a real multiplexer;

FIG. 7B a spectral display of the payload-signal components and reflected-signal components of the high-frequency signal;

FIG. 7C a spectral display of the oscillator signal of the local oscillator;

FIG. 7D a spectral display of a baseband or intermediate-frequency band signal;

DESCRIPTION AND PREFERRED EMBODIMENTS

Figure 5:
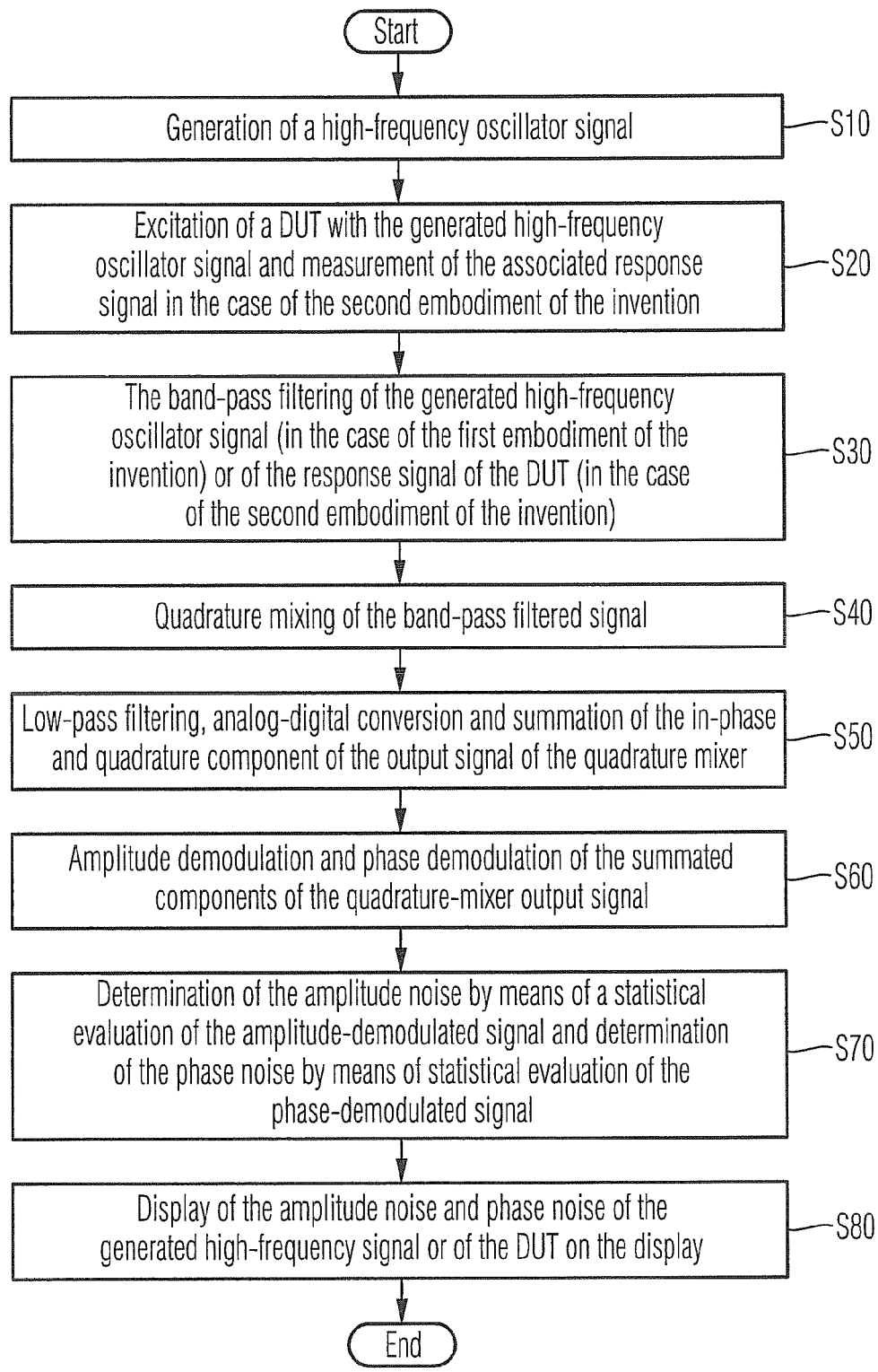
FIG. 5 a flowchart of a first sub-variant of a first and second embodiment of the method according to the invention.
Figure 6:
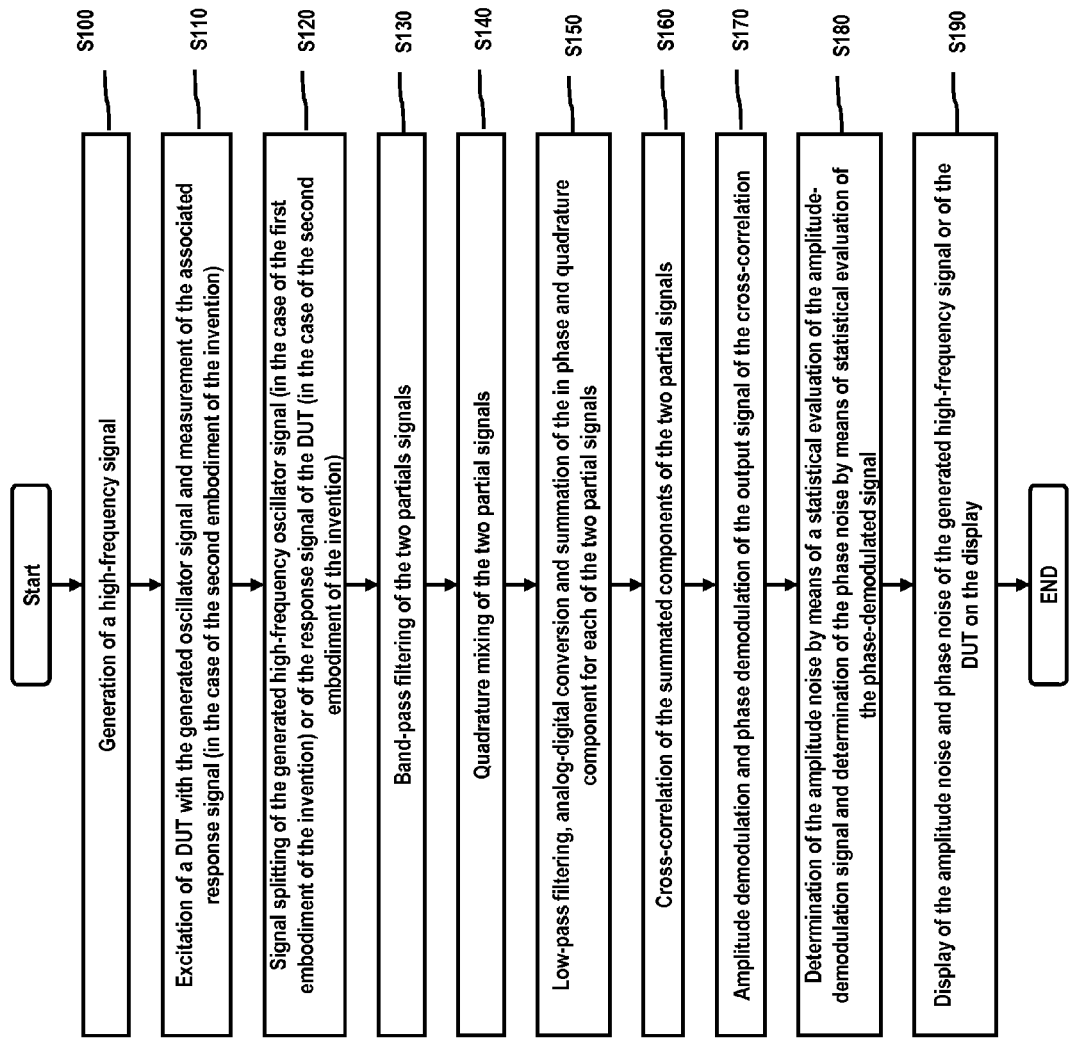
FIG. 6 a flowchart of a second sub-variant of a first and second embodiment of the method according to the invention.

Before the individual embodiments and sub-variants of the device according to the invention are described on the basis of the block-circuit diagrams in FIGS. 1 to 4, and the method according to the invention is described in detail on the basis of the flowcharts in FIGS. 5 and 6, the mathematical interrelationships relevant for an understanding of the invention will be explained in the following.

In the case of a real mixer, a high-frequency signal, of which the spectrum a lower sideband with the desired payload-signal component RF (shown in FIG. 7B with a triangular characteristic) and an upper sideband with the undesired reflected-signal component IM (shown in FIG. 7B with a rectangular characteristic), is mixed with an oscillator signal LO at the frequency $\omega_{Lo}$ according to FIG. 7C and equation (3).

Payload-signal components and reflected-signal components are not necessarily identical to one another in the individual frequency bands, since additional noise or spectral components of an interference signal scattered from an interferer can occur instead of the reflected-signal components, for example, in the case of a single-sideband transmission. By way of simplification of the further mathematical considerations, the payload-signal components RF of the high-frequency signal according to equation (1) are approximated by a harmonic signal at the mid-frequency $\omega_{RF}$ of the lower sideband, and the reflected-signal and/or interference-signal components IM of the high-frequency signal according to equation (2) are approximated by a harmonic signal at the mid-frequency $\omega_{Imag}$ of the upper sideband.

A transmission of the payload-signal component in the upper sideband and, correspondingly, of the associated reflected-signals in the lower sideband is also possible and is also covered by the invention.

$$RF \doteq \cos(\omega_{RF} \cdot t) \quad (1)$$

$$IM \doteq \cos(\omega_{Imag} \cdot t) \quad (2)$$

$$LO = \cos(\omega_{Lo} \cdot t) \quad (3)$$

The baseband or intermediate-frequency band signal generated in the real mixer—designated in the following as R—is obtained according to equation (4):

$$R = RF \cdot LO + IM \cdot LO = \cos(\omega_{RF} \cdot t) \cdot \cos(\omega_{LO} \cdot t) + \cos(\omega_{Imag} \cdot t) \cdot \cos(\omega_{LO} \cdot t) \quad (4)$$

The multiplication of the individual factors in equation (4) using trigonometric relationships results, under the physical premise that only terms at positive frequencies are permitted, in a relationship for the generated baseband or intermediate-frequency signal R according to equation (5).

$$R = 0.5 \cdot (\cos((\omega_{LO}-\omega_{RF}) \cdot t) + \cos((\omega_{LO}+\omega_{RF}) \cdot t)) + +0.5 \cdot (\cos((\omega_{Imag}-\omega_{LO}) \cdot t) + \cos((\omega_{LO}+\omega_{Imag}) \cdot t)) \quad (5)$$

If the baseband or intermediate-frequency band signal R generated by the real mixer, as illustrated in FIG. 7A, is subjected to a low-pass filtering which removes the additive intermodulation products, the mathematical interrelationship in equation (6) is obtained for the baseband or intermediate-frequency band signal R'.

$$R' = 0.5 \cdot \cos((\omega_{LO}-\omega_{RF}) \cdot t) + 0.5 \cdot \cos((\omega_{Imag}-\omega_{LO}) \cdot t) \quad (6)$$

The frequency interval $\omega_{LO}-\omega_{RF}$ of the mid-frequency $\omega_{RF}$ of the lower sideband relative to the oscillator frequency $\omega_{Lo}$ is identical to the frequency interval $\omega_{Imag}-\omega_{Lo}$ of the mid-frequency $\omega_{Imag}$ of the upper sideband relative to the oscillator frequency $\omega_{Lo}$ and corresponds to the frequency $\omega_{IF}$ illustrated in FIG. 7D. The payload-signal component in the generated baseband or intermediate-frequency band signal R' consequently provides the same mid-frequency $\omega_{IF}$ and the same phase $\omega_{IF} \cdot t$ as the reflected-signal or respectively interference-signal components in the generated baseband or intermediate-frequency band signal R.

As shown in FIG. 7D, the spectral components of the payload signal are superposed with the reflected-signal and/or interference-signal components in the generated baseband or intermediate-frequency band signal R'. A splitting of the payload-signal components from the reflected-signal or respectively interference-signal components and, in particular, a removal of the reflected-signal and/or interference-signal components from the payload-signal components in the generated baseband or intermediate-frequency band signal R' is therefore disadvantageously not possible with the use of a real mixer according to the prior art.

Figure 8A:
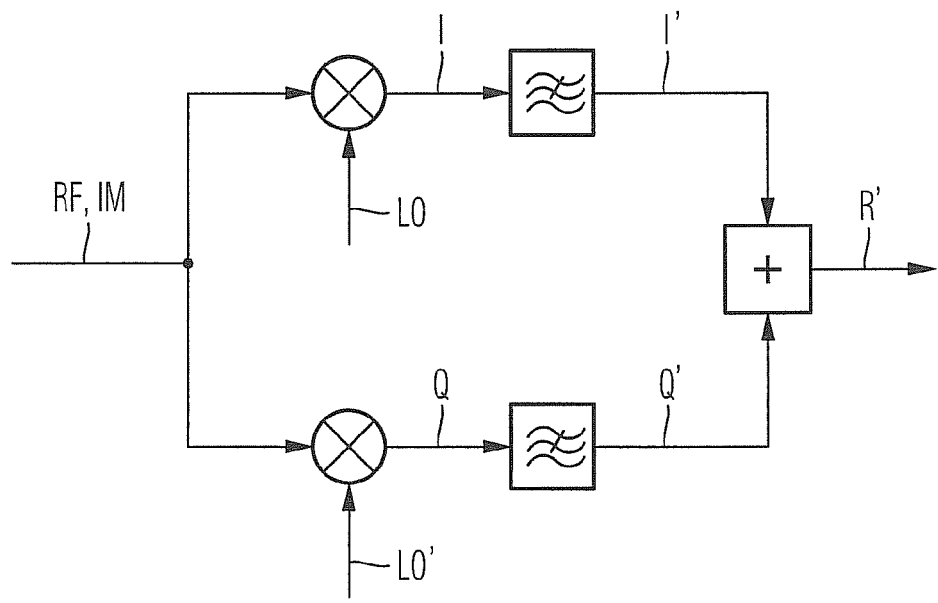
FIG. 8A a block-circuit diagram of a quadrature mixer.

With the use according to the invention of a quadrature mixer according to FIG. 8A for the in-phase component I of the baseband or intermediate-frequency band signal, a mathematical interrelationship equivalent to the real mixer is obtained according to equation (7). After a low-pass filtering, the mathematical interrelationship for the in-phase component I' of the baseband or intermediate-frequency band signal is obtained according to equation (8).

$$I = RF \cdot LO + IM \cdot LO = \cos(\omega_{RF} \cdot t) \cdot \cos(\omega_{LO} \cdot t) + \cos(\omega_{Imag} \cdot t) \cdot \cos(\omega_{LO} \cdot t) \quad (7)$$

$$I' = 0.5 \cdot \cos((\omega_{LO}-\omega_{RF}) \cdot t) + 0.5 \cdot \cos((\omega_{Imag}-\omega_{LO}) \cdot t) \quad (8)$$

Figure 8B:
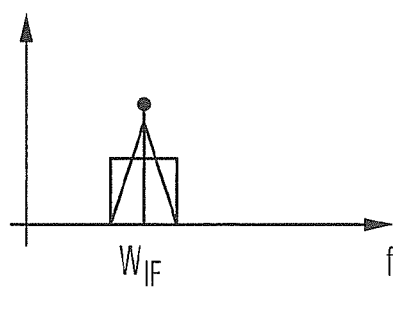
FIG. 8B a spectral display of the in-phase component of the payload-signal components and the reflected-signal components in the baseband or intermediate-frequency band signal.

As illustrated in FIG. 8B, the in-phase components of the payload-signal components and the reflected-signal or respectively interference-signal components provide identical mid-frequencies $\omega_{LO}-\omega_{RF}=\omega_{Imag}-\omega_{LO}=\omega_{IF}$ and are phase-synchronous to one another.

For the quadrature component Q of the baseband or intermediate-frequency band signal, the mathematical interrelationship according to equation (10) is obtained because of the oscillator signal LO' of the quadrature channel phase-displaced by 90° relative to the oscillator signal LO of the in-phase channel corresponding to equation (9). Taking into consideration only spectral components with positive frequencies, and after a low-pass filtering in which the additive intermodulation products are removed, the mathematical interrelationship for the quadrature component Q' of the baseband or intermediate-frequency band signal is obtained according to equation (11):

$$LO' = \sin(\omega_{Lo} \cdot t) \quad (9)$$

$$Q = RF \cdot LO' + IM \cdot LO' = \cos(\omega_{RF} \cdot t) \cdot \sin(\omega_{LO} \cdot t) + \cos(\omega_{Imag} \cdot t) \cdot \sin(\omega_{LO} \cdot t) \quad (10)$$

$$Q' = 0.5 \cdot \sin((\omega_{LO}-\omega_{RF}) \cdot t) - 0.5 \cdot \sin((\omega_{Imag}-\omega_{LO}) \cdot t) \quad (11)$$

Figure 8C:
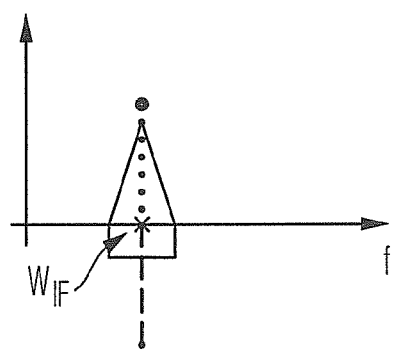
FIG. 8C a spectral display of the quadrature component of the payload-signal components and reflected-signal components in the baseband or intermediate-frequency band signal.

As illustrated in FIG. 8C, the quadrature components of the payload-signal components and the reflected-signal components or respectively interference-signal components provide identical frequencies $\omega\omega_{LO}-\omega_{RF}=\omega_{Imag}-\omega_{LO}=\omega_{IF}$ and are phase-displaced by 180° relative to one another.

The addition of the in-phase component and the quadrature component multiplied by the imaginary unit j for the payload signal components in the baseband or intermediate-frequency band signal R' is obtained according to equation (12). The multiplication of the quadrature component by the imaginary unit j in this context corresponds to a phase rotation of 90°.

$$R' = 0.5 \cdot \cos((\omega_{LO}-\omega_{RF}) \cdot t) + j \cdot 0.5 \cdot \sin((\omega_{LO}-\omega_{RF}) \cdot t) = \quad (12)$$
$$= 0.5 \cdot \cos((\omega_{LO}-\omega_{RF}) \cdot t) + 0.5 \cdot \sin((\omega_{LO}-\omega_{RF}) \cdot t + 90°)$$
$$= \cos((\omega_{LO}-\omega_{RF}) \cdot t)$$

In the case of a quadrature mixing for the payload-signal components of the high-frequency signal, the in-phase and quadrature components of the associated baseband or intermediate-frequency band signal are superposed constructively.

The addition of the in-phase component and the quadrature component multiplied by the imaginary unit j for the reflected-signal or respectively interference-signal components in the baseband or intermediate-frequency band signal R' is obtained according to equation (13).

$$R' = 0.5 \cdot \cos((\omega_{Imag}-\omega_{LO}) \cdot t) - j \cdot 0.5 \cdot \sin((\omega_{Imag}-\omega_{LO}) \cdot t) = \quad (13)$$
$$= 0.5 \cdot \cos((\omega_{Imag}-\omega_{LO}) \cdot t) - 0.5 \cdot \sin((\omega_{Imag}-\omega_{LO}) \cdot t + 90°) = 0$$

The reflected-signal or respectively interference-signal components of the high-frequency signal cancel each other out, as shown in equation (13), through the quadrature mixing the in-phase and quadrature component. Reflected-signal or respectively interference-signal components of the high-frequency signal therefore advantageously no longer occur in the baseband or intermediate-frequency band signal.

Figure 1:
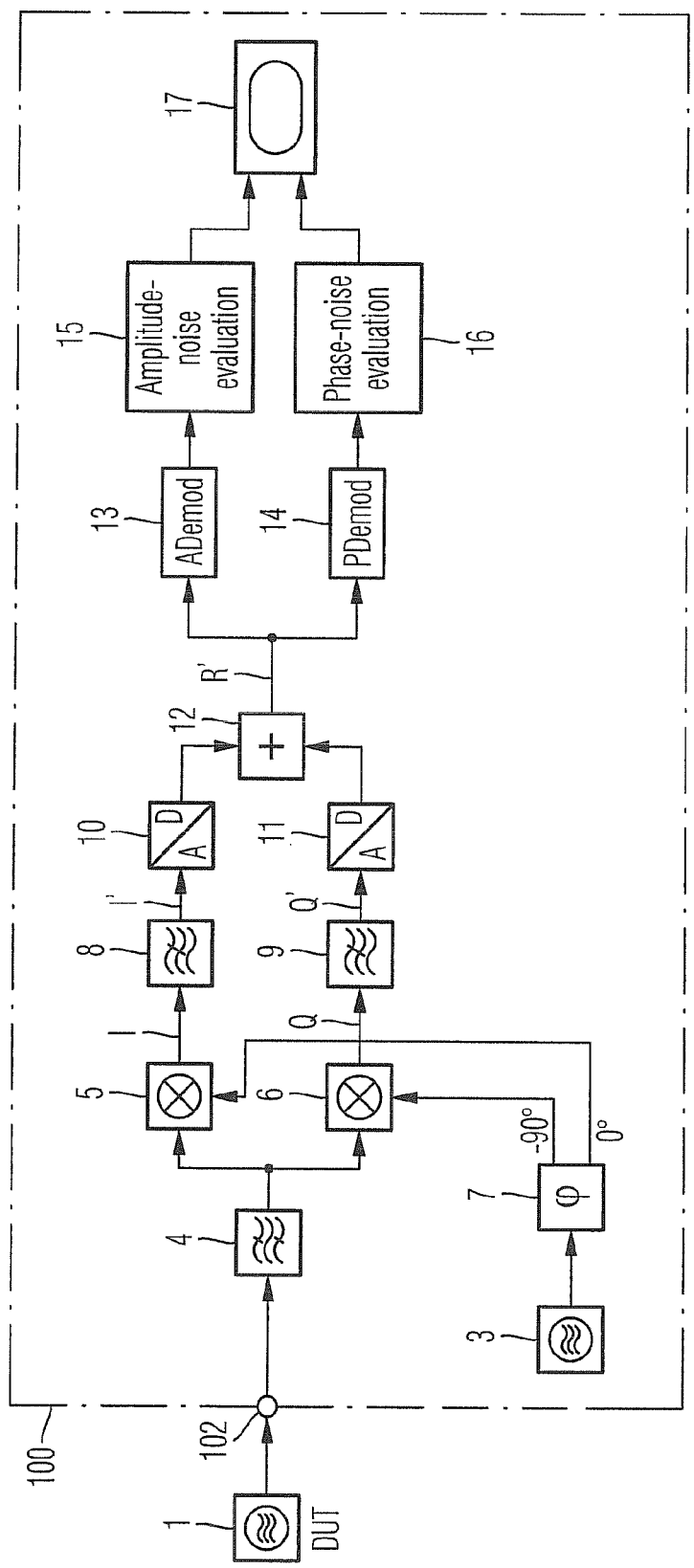
FIG. 1 a block-circuit diagram of a first sub-variant of a first embodiment of the device according to the invention.
Figure 2:
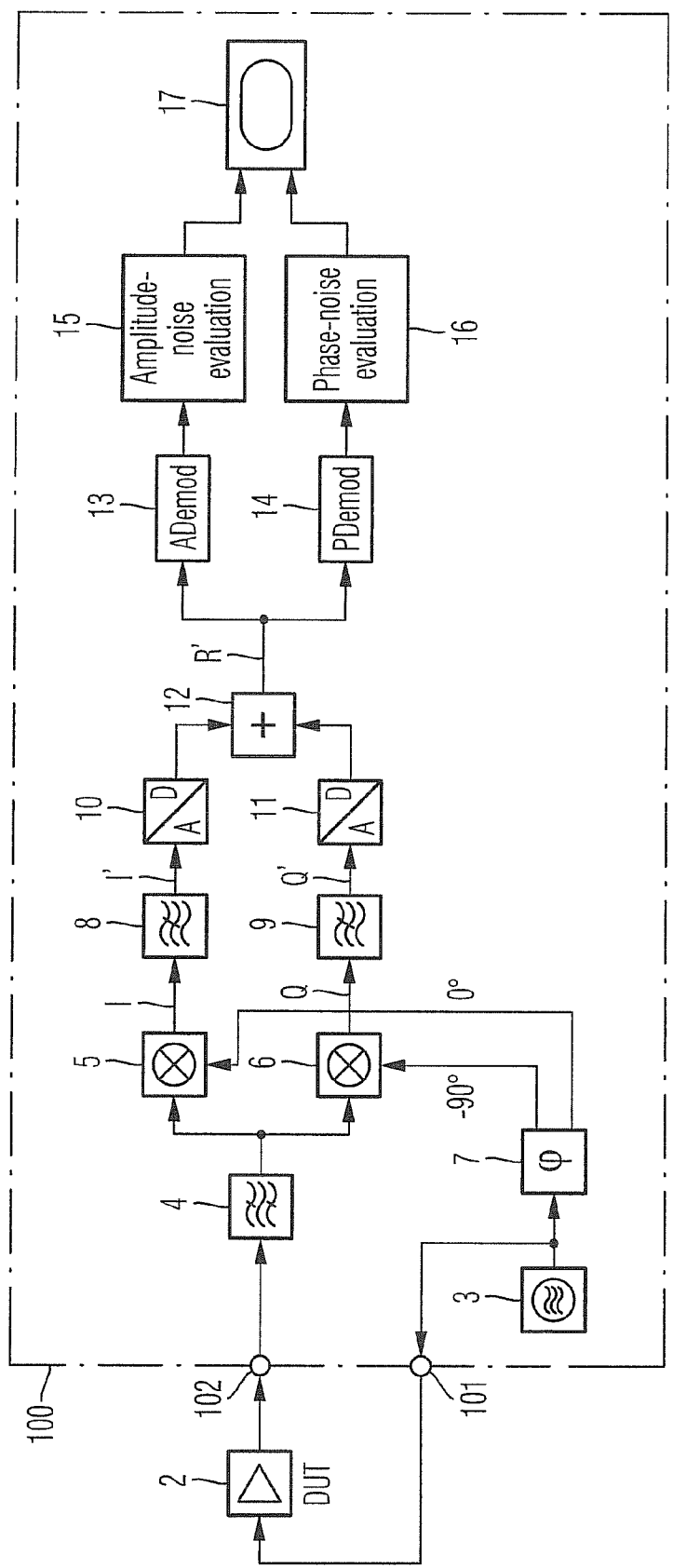
FIG. 2 a block-circuit diagram of a first sub-variant of a second embodiment of the device according to the invention.

In the following, the first sub-variant of the first and second embodiment of the method according to the invention is explained in detail on the basis of the flowchart in FIG. 5 in combination with the first sub-variant of the first embodiment of the device according to the invention on the basis of the block-circuit diagram in FIG. 1, and the first sub-variant of the second embodiment of the device according to the invention on the basis of the block diagram in FIG. 2.

In the first method step S10, a high-frequency oscillator signal, which is typically superposed with an amplitude noise and phase noise, is generated. In the first embodiment of the invention, in which the amplitude noise and phase noise contained within the high-frequency signal is determined according to FIG. 1, the generation of the high-frequency signal is typically implemented in a frequency oscillator 1 positioned outside the device 100 according to the invention. Alternatively, the generation of the high-frequency signal can also be implemented in a signal-generator unit.

In the second embodiment of the invention, in which the amplitude noise and/or phase noise generated in a device under test 2 positioned outside the device 100 according to the invention is determined, the high-frequency signal generated in a local oscillator 3 of the quadrature mixer is used in order to generate the high-frequency oscillator signal for the excitation of the device under test 2. With regard to the correct determination of the amplitude and phase noise caused by the device under test 2, a local oscillator 3 should be selected and designed in such a manner that its amplitude noise and phase noise is significantly lower than the amplitude noise and phase noise of the device under test 2.

In the second method step S20, which is implemented only in the second embodiment of the invention, the device under test 2 is excited with the high-frequency signal generated by the local oscillator 3 by guiding the oscillator signal generated by the local oscillator 3 from the local oscillator 3 disposed within the device 100 according to the invention, via an output port 101, to the input of the device under test 2 positioned outside the device 100 according to the invention. The associated response signal of the device under test 2, which is measured, additionally contains the amplitude noise and phase noise generated in the device under test 2 alongside the amplitude noise and phase noise of the local oscillator 3 already contained in the original excitation signal.

The next method step S30 contains the band-pass filtering of the high-frequency signal generated in the first embodiment of the invention in the frequency oscillator 1, or respectively of the high-frequency response signal registered at the output of the device under test 2 in the second embodiment of the invention with an excitation of the device under test 2. For this purpose, the high-frequency signal at the output of the frequency oscillator 1 or respectively the device under test 2 is guided via the input port 102 to the input of a band-pass filter 4 disposed within the device 100 according to the invention.

In this context, the harmonics, that is, the higher-harmonic spectral components, contained in the high-frequency signal of the frequency oscillator 1 or respectively in the high-frequency response signal of the device under test 2 are removed through the low-pass characteristic of the band-pass filter 4, in order not to produce any undesired inter-modulation products in the subsequent quadrature mixing with the harmonics contained in the oscillator signal of the local oscillator 3, which come to be disposed spectrally adjacent to the first-order intermodulation products relevant for determining the amplitude noise and/or phase noise.

Using the high-pass characteristic of the band-pass filter 4, low-frequency noise components not relevant for determining the amplitude noise and/or phase noise are filtered out from the high-frequency signal of the frequency oscillator 1, or respectively from the high-frequency response signal of the device under test 2.

The high-frequency harmonics and the low-frequency noise components of the high-frequency signal are absorbed by a band-pass filter 3 constructed appropriately for this purpose, in order to avoid a disturbing reflection of the filtered-out spectral components of the high-frequency signal to the frequency oscillator 1 to be investigated or respectively to the device under test 2, and therefore to avoid a disturbing superposition on the high-frequency signal under investigation. For this purpose, the band-pass filter 3 is constructed from a frequency crossover network for splitting the spectral components into the low-frequency and high-frequency stop range and the mid-frequency pass range, and an ohmic impedance for each of the two stop ranges for the complete dissipation of each of the spectral components of the high-frequency signal.

In the next method step S40, the band-pass filtered high-frequency signal under investigation is supplied to a quadrature mixer for mixing into the baseband or into an intermediate-frequency band disposed in the proximity of the zero frequency. For this purpose, the band-pass filtered high-frequency signal under investigation is supplied to a mixer 5 disposed in the in-phase channel and to a mixer 6 disposed in the quadrature channel. The mixer 5 disposed in the in-phase channel is supplied, with the interconnection of a phase shifter 7, with an oscillator signal phase-synchronous to the oscillator signal of the local oscillator 3, while the mixer 6 disposed in the quadrature channel is supplied, with the interconnection of the phase-shifter 7, with an oscillator signal phase-shifted through 90° relative to the oscillator signal of the local oscillator 3.

In the next method step S50, the additive intermodulation products are removed from the in-phase component I generated in the mixer 5 and the quadrature component Q generated in the mixer 6 of the baseband or respectively intermediate-frequency band signal in a low-pass filter 8 and 9 disposed downstream in each case.

Also in method step S50, an analog-digital conversion of the low-pass filtered in-phase component I' of the baseband or respectively intermediate-frequency band signal is implemented in a downstream analog-digital converter 10, and of the low-pass filtered quadrature component Q' of the baseband or respectively intermediate-frequency band signal in a downstream analog-digital converter 11.

Finally, also in method step S50, the complex baseband or respectively intermediate-frequency band signal R' is obtained in a summation unit 12 from the digital in-phase component I' and the digital quadrature component Q' of the baseband or respectively intermediate-frequency band signal.

In the next method step S60, in each case from the complex baseband or respectively intermediate-frequency band signal R', the amplitude information contained in the digital sampled values of the complex baseband or respectively intermediate-frequency band signal R' is determined in a connected amplitude-demodulator 13, and the phase information contained in each case in the digital sampled values of the complex baseband or respectively intermediate-frequency band signal R' is determined in a phase demodulator 14 connected in parallel to the former. A cordic module which determines the associated magnitude and the associated phase from the in-phase and quadrature component of the complex baseband respectively intermediate-frequency band signal R' can be used, for example, as a combined amplitude-demodulator and phase-demodulator.

In the next method step S70, a statistical determination of noise parameters which characterise the amplitude noise in the baseband or respectively intermediate-frequency band signal is implemented according to conventional calculation formulae and calculation methods on the basis of the individual amplitude values in a unit for amplitude-noise evaluation 15 adjoining the amplitude-demodulator 13.

In an equivalent manner, a statistical determination of noise parameters which characterise the phase noise in the baseband or respectively intermediate-frequency band signal is implemented according to conventional calculation formulae and calculation methods on the basis of the individual phase values in a unit for phase-noise evaluation 16 adjoining the phase-demodulator 14.

The noise parameters determined in this manner for the amplitude noise and/or phase noise represent only an approximation for the amplitude noise and/or phase noise contained in the high-frequency signal, since the amplitude noise and phase noise contained in the baseband or respectively intermediate-frequency band signal especially also contain the amplitude noise and phase noise of the two mixers 5 and 6 and of the two analog-digital converters 10 and 11.

In the case of the determination of the amplitude noise and phase noise generated by the device under test 2, the amplitude noise and phase noise already contained in the excitation signal additionally falsifies the determined amplitude noise and phase noise.

In the final method step S80, the determined amplitude noise and phase noise of the high-frequency signal generated by the frequency oscillator 1 in the first embodiment of the invention or generated by the device under test 2 in the second embodiment of the invention are displayed in an adjoining display device 17. Additionally, the noise parameters of the amplitude noise and/or phase noise determined in the unit for amplitude-noise evaluation 15 and in the unit for phase-noise evaluation 16 can be optionally displayed on the display device 17.

In the following, the second sub-variant of the first and second embodiment of the method according to the invention will be explained on the basis of the flowchart in FIG. 6 in combination with the second sub-variant of the first embodiment of the device according to the invention on the basis of the block-circuit diagram in FIG. 3 and respectively the second embodiment of the device according to the invention on the basis of the block-circuit diagram in FIG. 4.

In the first method step S100, in an equivalent manner to method step S10 in the first sub-variant of the first and second embodiment of the method according to the invention, a high-frequency signal is generated either in a frequency oscillator 1 or in a local oscillator 3 associated with the quadrature mixer.

In the next method step S110, also in an equivalent manner to method step S20 in the first sub-variant of the second embodiment of the method according to the invention, the excitation of the device under test 2, which generates an amplitude noise and phase noise, is implemented with the generated high-frequency signal, and the measurement of the associated response signal superposed with the amplitude noise and phase noise of the device under test 2 is implemented. For the excitation of the device under test 2, the oscillator signal of one of the local oscillators $3_1$ and $3_2$ can be used—in FIG. 4, the oscillator signal generated by the local oscillator $3_1$ is used.

The next method step S120 contains a signal splitting of the high-frequency signal superposed with an amplitude noise and phase noise in a unit for signal splitting 18 into two high-frequency partial signals superposed with the same amplitude noise and phase noise. The two generated partial signals at the output of the unit for signal splitting 18 are phase-synchronous with one another and approximately identical, and by comparison with the high-frequency signal at the input of the unit for signal splitting 18, attenuated in total, for example, by 3 dB.

In the next method step S130, the two high-frequency partial signals are each supplied to a band-pass filter $4_1$ and $4_2$, which absorb higher-harmonic spectral components and low-frequency noise components contained in each of the two high-frequency partial signals. In this case, the absorption prevents not only the reflection of the higher-harmonic spectral components and the low-frequency noise components in the two high-frequency partial signals to the frequency oscillator 1 or respectively to the device under test 2, but also the reflection of the higher-harmonic spectral components and the low-frequency noise components in the two high-frequency partial signals via the unit for signal splitting 18 into the channel of the respectively other high-frequency partial signal and therefore into the cross-correlator 19.

In the next method step S140, the band-pass filtered partial signals are each supplied to a quadrature mixer. The in-phase component of the first baseband or respectively intermediate-frequency band signal is generated in a first mixer $5_1$ from the first high-frequency partial signal, using an oscillator signal supplied to the first mixer $5_1$, while the quadrature component of the first baseband or respectively intermediate-frequency band signal is obtained in a second mixer $6_1$ from the first high-frequency partial signal, using an oscillator signal supplied to the second mixer $6_1$ and phase-shifted by 90° relative to the oscillator signal of the first mixer $6_1$.

In an equivalent manner, the in-phase component of the second baseband or respectively intermediate-frequency band signal is generated in a third mixer $5_2$ from the second high-frequency partial signal using an oscillator signal supplied to the third mixer $5_2$, while the quadrature component of the second baseband or respectively intermediate-frequency band signal is obtained in a third mixer $6_2$ from the second high-frequency partial signal using an oscillator signal supplied to the fourth mixer 62 and phase-shifted by 90° relative to the oscillator signal of the first mixer $6_1$.

Figure 3:
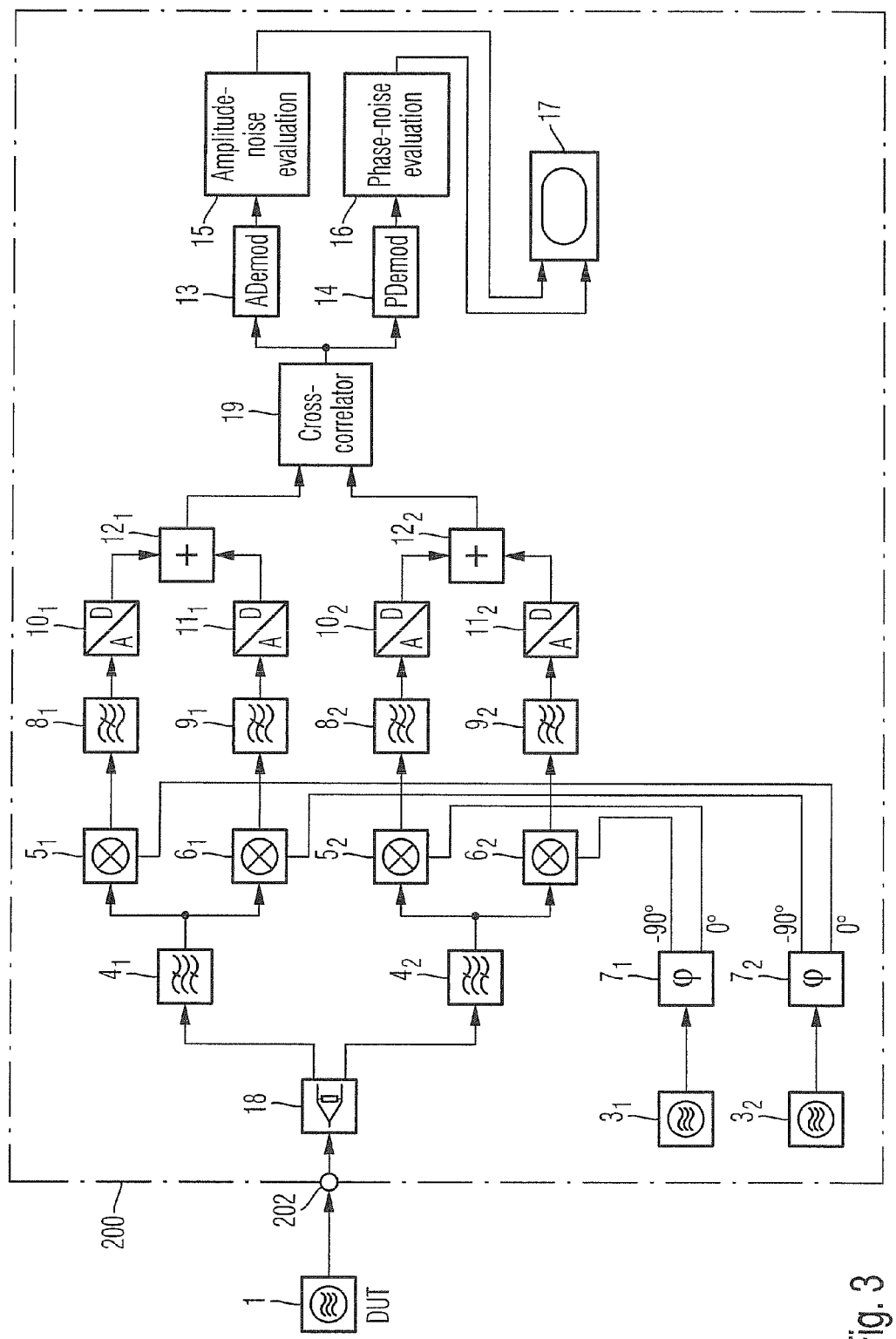
FIG. 3 a block-circuit diagram of a second sub-variant of a first embodiment of the device according to the invention.

The oscillator signal for the first mixer $5_1$ and the oscillator signal phase-shifted by 90° relative to this for the second mixer $6_1$ is generated in the first embodiment of the invention according to FIG. 3 with a local oscillator $3_1$ and a downstream phase shifter $7_1$, which generates from the oscillator signal generated by the local oscillator $3_1$ a phase-synchronous oscillator signal and an oscillator signal phase-shifted by 90° relative to this. The oscillator signal for the third mixer $5_2$ and the oscillator signal phase-shifted relative to this by 90° for the fourth mixer $6_2$ are generated in an equivalent manner in a further local oscillator $3_2$ and a phase-shifter $7_2$ connected downstream from the latter. The generation of the oscillator signals for the quadrature mixing of the first and second high-frequency partial signals in two different local oscillators $3_1$ and $3_2$ means that the mutually different amplitude noise and phase noise caused by each of the two local oscillators $3_1$ and $3_2$ is removed through the subsequent cross-correlation.

Figure 4:
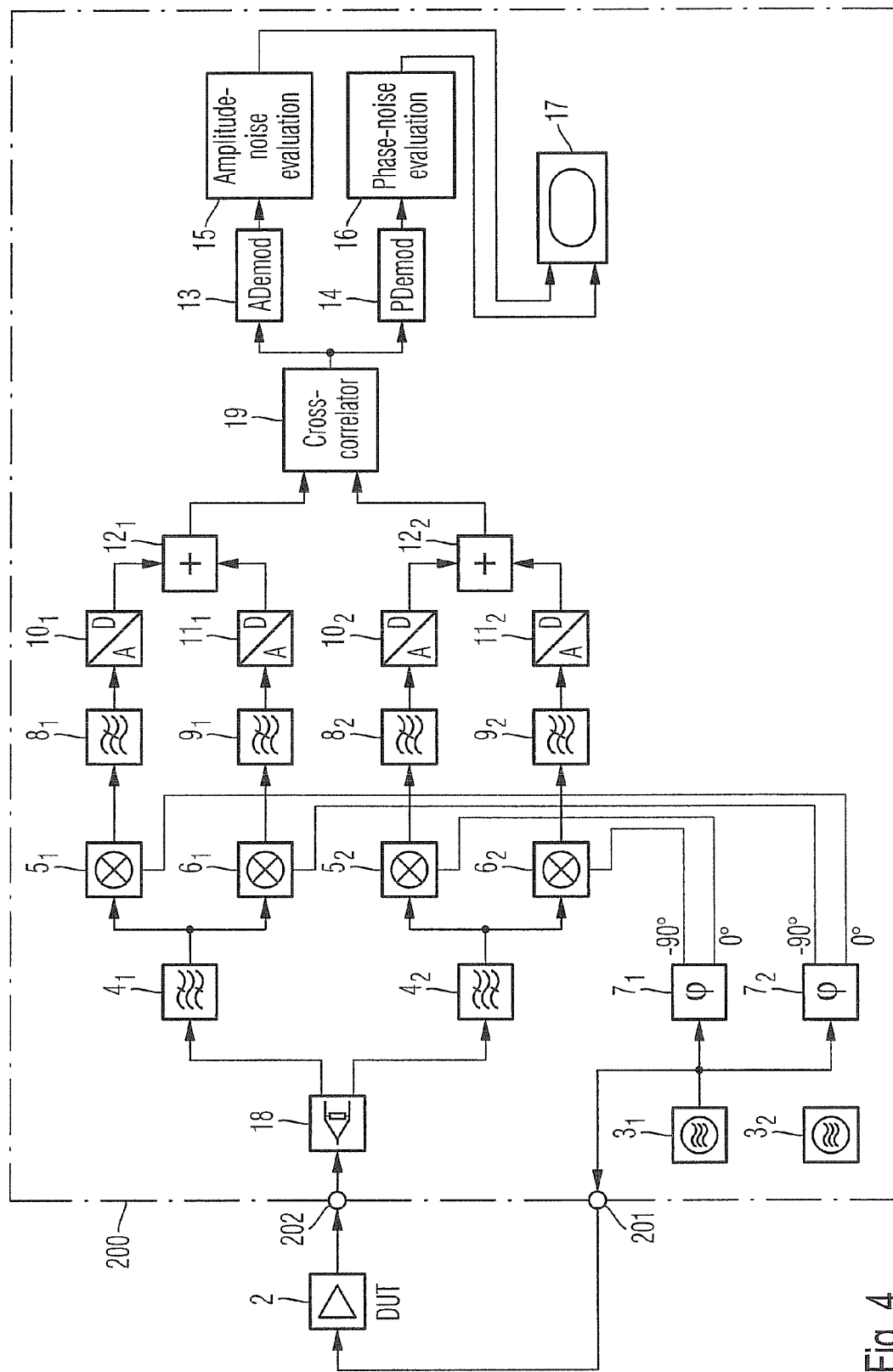
FIG. 4 a block-circuit diagram of a second sub-variant of the second embodiment of the device according to the invention.

By contrast, in the second embodiment of the invention according to FIG. 4, the mixers $5_1$ and $5_2$ are supplied with the identical oscillator signal, which is phase-synchronous to the oscillator signal of a single local oscillator—in FIG. 4, the oscillator signal of the local oscillator $3_1$—, while the mixers $6_1$ and $6_2$ are supplied with the identical oscillator signal, which is phase-shifted relative to the oscillator signal of the local oscillator $3_1$. In the second embodiment of the invention, a splitting of the oscillator signals for the first and second high-frequency partial signal must not occur because the identical amplitude noise and phase noise occurs both in the high-frequency partial signals and also in the associated oscillator signals because of the excitation of the device under test 2 with the oscillator signal of the local oscillator $3_1$, and accordingly, in view of the quadrature mixing, no longer occurs in the subtractive intermodulation products as a result of the quadrature mixing of the amplitude noise and phase noise of the local oscillator $3_1$. The cross-correlation in this second embodiment of the invention continues to be necessary, since the subsequent analog-digital converter and the amplifiers, not illustrated in the drawings, also generate an undesired amplitude noise and phase noise.

The low-pass filtering of the in-phase component of the baseband or respectively intermediate-frequency band signal associated with the first high-frequency partial signal in a low-pass filter $8_1$ and the subsequent analog-digital conversion in an analog-digital converter $10_1$; the low-pass filtering of the quadrature component of the baseband or respectively intermediate-frequency band signal associated with the first high-frequency partial signal in a low-pass filter $9_1$ and the subsequent analog-digital conversion in an analog-digital converter $11_1$; the low-pass filtering of the in-phase component of the baseband or respectively intermediate-frequency band signal associated with the second high-frequency partial signal in a low-pass filter $8_2$ and the subsequent analog-digital conversion in an analog-digital converter $10_2$ and the low-pass filtering of the quadrature component of the baseband or respectively intermediate-frequency band signal associated with the second high-frequency partial signal in a low-pass filter $9_2$ and the subsequent analog-digital conversion in an analog-digital converter $11_2$ take place in the next method step S150.

Also in method step S150, the generation of the baseband or respectively intermediate-frequency band signal corresponding to the first high-frequency partial signal is implemented through summation of the associated in-phase and quadrature component in a summation unit $12_1$, and the generation of the baseband or respectively intermediate-frequency band signal corresponding to the second high-frequency partial signal is implemented through summation of the associated in-phase and quadrature component in a summation unit $12_2$.

In the next method step S160, the baseband or respectively intermediate-frequency band signal generated in the summation unit $12_1$ and corresponding to the first high-frequency partial signal and the baseband or respectively intermediate-frequency band signal generated in the summation unit $12_2$ and corresponding to the second high-frequency signal are supplied to a cross-correlator 19 for a cross-correlation. The signal at the output of the cross-correlator 19 resulting from the cross-correlation contains only the mutually identical amplitude noise and phase noise components of the first and second high-frequency partial signal, while the mutually different amplitude noise and phase noise components, which are generated in the two local oscillators $3_1$ and $3_2$, in the analog-digital converters $10_1$, $10_2$, $11_1$ and $11_2$, and in additional amplifiers, not illustrated in FIGS. 3 and 4, and which flow into the baseband or respectively intermediate-frequency band signal associated with each of the first and second high-frequency partial signals, do not occur in the correct cross-correlation result.

In the next method step S170, in an equivalent manner to method step S60 of the first sub-variant of the first and second embodiment of the method according to the invention, the signal at the output of the cross-correlator 19 is supplied to an amplitude-demodulator 13 and a phase-demodulator 14 for the determination of the amplitude noise and/or phase noise contained in the high-frequency signal under investigation.

The statistical evaluation of the result of the amplitude demodulation in a unit for amplitude-noise evaluation 15 and the result of the phase demodulation in a unit for phase-noise evaluation 16 in method step S180 corresponds to method step S70 of the first sub-variant of the first and second embodiment of the method according to the invention.

In method step S190, the display of the amplitude-noise and phase-noise results on a display device 17 is implemented in an equivalent manner to method step S80 of the first sub-variant of the first and second embodiment of the method according to the invention.

The invention is not restricted to the illustrated embodiments and sub-variants of the method according to the invention and the device according to the invention. In particular, all combinations of the features claimed in the patent claims, of the features disclosed in each case in the description and of the features illustrated in each of the individual Figs. of the drawings are covered within the scope of the invention.

Other embodiments are within the scope and spirit of the invention. For example, due to the nature of software, functions described above can be implemented using software, hardware, firmware, hardwiring, or combinations of any of these. Features implementing functions may also be physically located at various positions, including being distributed such that portions of functions are implemented at different physical locations.

What is claimed is:
1. A method for determining an amplitude noise and phase noise contained within a signal, the method comprising steps of:
   quadrature mixing of the signal into a baseband or an intermediate-frequency band;
   determining the amplitude noise contained in the signal by amplitude demodulation of the signal mixed into the baseband or intermediate-frequency band; and
   determining the phase noise contained in the signal by phase demodulation of the signal mixed into the baseband or intermediate-frequency band,
   wherein before the quadrature mixing, a band-pass filtering of the signal is implemented, and
   wherein a band-pass filter is constructed from a frequency crossover network and an ohmic impedance for each of two stop ranges.
2. The method according to claim 1, wherein the case of the quadrature mixing into the baseband, the frequency of a local oscillator required for the quadrature mixing corresponds to the frequency of the signal.

3. The method according to claim 1, wherein the band-pass filtering filters out higher-harmonic spectral components and low-frequency noise components contained in the signal.

4. The method according to claim 1, wherein the amplitude noise and the phase noise contained in the signal is an amplitude noise and phase noise generated by a device under test, which, in the case of an excitation of the device under test with an excitation signal, is contained in an associated response signal.

5. The method according to claim 4, wherein the excitation signal of the device under test is the signal generated by a local oscillator required for the quadrature mixing.

6. The method according to claim 1, wherein the quadrature mixing of the signal is implemented by quadrature mixing of two partial signals containing the amplitude noise and phase noise which occur through signal splitting of the signal containing the amplitude noise and phase noise.

7. The method according to claim 6, wherein the partial signals mixed in each case and containing the amplitude noise and phase noise are supplied for a cross-correlation.

8. The method according to claim 7 comprising:
determining the amplitude noise contained in the signal by amplitude demodulation of an output signal from the cross-correlation; and
determining the phase noise contained in the signal by phase demodulation of the output signal from the cross-correlation.

9. A device for determining an amplitude noise and phase noise contained within a signal, the device comprising:
a quadrature mixer for mixing the signal containing the amplitude noise and phase noise into a baseband or an intermediate-frequency band;
an amplitude demodulator connected downstream of the quadrature mixer for determining the amplitude noise contained within the signal; and
a phase demodulator connected downstream of the quadrature mixer for determining the phase noise contained within the signal,
wherein a band-pass filter is connected upstream of the quadrature mixer, and
wherein the band-pass filter is constructed from a frequency crossover network and an ohmic impedance for each of two stop ranges.

10. The device according to claim 9, wherein the quadrature mixer is connected to each of two outputs of a unit for signal splitting, at the input of which the signal containing the amplitude noise and phase noise is present.

11. The device according to claim 10, wherein band-pass filters are connected downstream of the unit for signal splitting.

12. The device according to claim 10, wherein between the two quadrature mixers and the amplitude demodulator and the phase demodulator a cross-correlator is connected.

13. The device according to claim 12, wherein the amplitude demodulator and the phase demodulator is or respectively are connected downstream of the cross-correlator.

14. The device according to claim 9, wherein the signal containing the amplitude noise and phase noise is present at an output of a device under test which generates amplitude noise and phase noise.

15. The device according to claim 14, wherein at the input of the device under test, a signal generated by a local oscillator of the quadrature mixer is present.

* * * * *